United States Patent
Despont et al.

(10) Patent No.: US 7,146,067 B2
(45) Date of Patent: Dec. 5, 2006

(54) MICROSYSTEM SWITCHES

(75) Inventors: Michel Despont, Adliswil (CH); Ute Drechsler, Rueschlikon (DE); Hugo E. Rothuizen, Adliswil (CH); Peter Vettiger, Langnau (CH); Roland W. Widmer, Oberglatt (CH)

(73) Assignee: International Business Machines Corporation, Armonk, NY (US)

( * ) Notice: Subject to any disclaimer, the term of this patent is extended or adjusted under 35 U.S.C. 154(b) by 250 days.

(21) Appl. No.: 10/482,828

(22) PCT Filed: Jun. 7, 2002

(86) PCT No.: PCT/IB02/02117

§ 371 (c)(1),
(2), (4) Date: Aug. 5, 2004

(87) PCT Pub. No.: WO03/014789

PCT Pub. Date: Feb. 20, 2003

(65) Prior Publication Data

US 2004/0252936 A1    Dec. 16, 2004

(30) Foreign Application Priority Data

Jul. 5, 2001    (EP) .................................. 01810658

(51) Int. Cl.
*G02B 6/26*    (2006.01)
*G02B 6/42*    (2006.01)
(52) U.S. Cl. ........................................ 385/16; 359/291
(58) Field of Classification Search .................... 385/16
See application file for complete search history.

(56) References Cited

U.S. PATENT DOCUMENTS 5,867,302 A * 2/1999 Fleming ..................... 359/291

FOREIGN PATENT DOCUMENTS

FR    2753565 A1 * 3/1998

* cited by examiner

Primary Examiner—Brian Healy
Assistant Examiner—Mary El-Shammaa
(74) Attorney, Agent, or Firm—Robert M. Trepp (57) ABSTRACT

A microsystem switch (1, 20, 25, 30, 33) has a support (2) defining a recess (3), and a flexible bridge (6) is mounted on the support (2) bridging the recess (3). The bridge (6) is shaped so as to hold selectively a concave stable state, in which the bridge bulges into the recess (3), and a convex stable state in which the bridge bulges out of the recess (3). The switch includes an actuator (8, 9; 26, 27) for effecting flexing of the bridge (6) between the stable states, and a switching element (7, 31, 34) is mounted on the bridge (6) such that movement of the bridge between the stable states moves the switching element between an on position and an off position. According to another design, a microsystem switch (40, 55) has a support (41) defining a recess (42), and an elongate torsion member (44) is mounted on the support (41) bridging the recess (42). A flexible bridge (43, 56) is mounted on the support (41) bridging the recess (42) in a direction substantially perpendicular to the torsion member (44). The bridge (43, 56) is connected to the torsion member (44) at the cross-point thereof so that a first section of the bridge extends between the cross-point and one side of the recess (42) and a second section of the bridge extends between the cross-point and the opposite side of the recess (42). The bridge (43, 56) is shaped so as to hold selectively a first stable state, in which the first section of the bridge bulges into the recess and the second section of the bridge bulges out of the recess, and a second stable state in which this configuration is reversed. A switching element (45) is mounted at the cross-point of the bridge (43, 56) and torsion member (44), and an actuator (46a, 46b; 58a, 58b) is again provided for effecting flexing of the bridge (43, 56) between the stable states. Here, movement of the bridge (43, 56) between the stable states effects twisting of the torsion member (44) and rotation of the switching element (45) between an on position and an off position. Switching devices incorporating these switches, and switching apparatus comprising arrays of such switching devices, are also provided.

25 Claims, 7 Drawing Sheets

MICROSYSTEM SWITCHES

This invention relates generally to microsystem switches.

Microsystem switches, such as MEMS (Micro-Electro-Mechanical System) switches, are microfabricated devices which provide for high levels of integration. Various examples of microsystem switches are known. For example, International Patent Application No. WO 00/25160 discloses various optical MEMS switches for use in optical switching arrays. Here, optical waveguides are arranged in a grid with fluid-filled trenches formed at the cross-points of each pair of waveguides. The switches utilise MEMS mirrors which slide in the trenches between on positions, in which a mirror reflects light from an input waveguide into an output waveguide, and off positions in which a mirror is withdrawn from the optical path and light continues to propagate along the input waveguide. The switches may be formed on the same chip as the waveguide array or on a different chip which is flip-chip mounted with the waveguide array chip. In some embodiments of the switch the mirror actuator serves to slide the mirror in the plane of the chip. In another embodiment the mirror is mounted on a plate and activation of an electrostatic actuator causes flexing of the plate to lift the mirror into the off position in an out-of-plane direction.

A key problem with existing switch designs of the type described above is that power must be applied continuously to hold the switch in one of its two operating positions. An efficient microsystem switch design, particularly in the context of switching arrays, should have a simple construction for ease of fabrication, and offer low power consumption. A paper entitled "A Unique Latching 2×2 MEMS Fibre Optics Switch", Hichwa et al, OMEMS 2000, 21 Aug. 2000, discloses a bistable optical switch with a complex electrostatic mirror actuation system, fabricated in the space between two crossed waveguides, for sliding the mirror in the plane of the substrate into the cross-point of the waveguides. The actuation system employs a set of comb drives and two flexible hinges for latching the device in its stable states. A flip-chip bonded 4×4 array design based on this switch is discussed in "4×4 Matrix Switch Based on MEMS Switches and Integrated Waveguides", Dellman et al, pp 1332–1335, Transducer '01, Eurosensors XV, the 11th International Conference on Solid-State Sensors and Actuators, Jun. 10–14, 2001, Digest of Technical Papers, Volume 2, published by Spinger. While this switch offers bistable operation, the size and complexity of the switching mechanism prejudices the objectives of an efficient array design.

According to one aspect of the present invention there is provided a microsystem switch comprising:

a support defining a recess;

a flexible bridge mounted on the support and bridging the recess, the bridge being shaped so as to hold selectively a concave stable state, in which the bridge bulges into the recess, and a convex stable state in which the bridge bulges out of the recess;

an actuator for effecting flexing of the bridge out of each of the stable states into the other of the stable states; and a switching element mounted on the bridge such that movement of the bridge between the stable states moves the switching element between an on position and an off position.

In embodiments of the invention therefore, switching is achieved by effecting flexing of the bistable bridge between its concave and convex stable states, thus moving the switching element into and out of the recess between its on and off positions. Embodiments of the invention thus offer a bistable switch with elegantly simple construction and operation as well as low power requirements. Switches embodying the invention are small to realise and easy to fabricate, allowing realisation of highly efficient switching arrays.

The flexible bridge can be shaped for bistable operation by preforming and/or prestressing the bridge, though preferably the bridge is prestressed whether or not it is preformed with a generally convex/concave shape. In this regard, it will be understood by those skilled in the art that fabrication processes to achieve a preformed shape can result, by their nature, in a certain degree of prestressing, so that the resulting structure is subject to some degree of stress in situ.

While embodiments can be envisaged where the bridge is formed in more than one section, for example one section on each side of the switching element, for simplicity of construction and fabrication the bridge preferably comprises a simple, flexible membrane. Moreover, the recess is preferably formed in a substantially flat surface of the support, the bridge being mounted on this surface so as to extend over the recess. Arrangements can of course be envisaged where the recess is defined by a raised structure of the support, and such a raised structure might be formed by extensions of the bridge, the point being that the recess, however defined, provides a space for the movement of the bridge. The former arrangement is preferred, however, as providing a particularly simple and compact design.

Various actuator mechanisms might be employed to effect flexing of the bridge between its stable states. The actuator could be arranged to impart an impulse to the bridge to toggle the switch between states. For example, embodiments can be envisaged where the actuator generates a surface acoustic wave to impart the toggling impulse. Various other possible actuator mechanisms will be discussed hereinafter. In preferred embodiments, however, the actuator comprises a pair of bimorph actuation layers, each bimorph actuation layer extending over a respective portion of the bridge so as to form therewith a bimorph structure. On activation of one of these layers, differential expansion in the corresponding bimorph structure exerts a force causing flexing of the bridge out of one stable state into the other stable state. The layers are arranged such that activation of one layer causes flexing of the bridge out of the convex stable state into the concave stable state, and activation of the other layer causes flexing of the bridge out of the concave stable state into the convex stable state. Various bimorph structures can be envisaged here, and the nature of the bimorph activation layers can vary accordingly. By way of example, embodiments can be envisaged where the bimorph actuation layers are formed of a porous material which swells when activated, by exposing the layer to humidity or some other appropriate activating agent, to produce the differential expansion in the bimorph structure. In particularly preferred embodiments however, each bimorph actuation layer comprise a heater which has a thermal expansion coefficient different to that of the portion of the bridge it overlays, whereby heating of the heater causes the differential expansion in the bimorph. This provides a particularly simple and efficient actuation mechanism exploiting bimorph forces to toggle the switch between states. Embodiments might be envisaged where the heaters are disposed on opposite surfaces of the bridge on the same side of the switching element. However, to avoid potential problems of heat conduction between the heaters through the thickness of the bridge, it is preferred that the heaters are disposed on opposite sides of the switching element. In some embodiments, the heaters are disposed on opposite surfaces of the bridge and on opposite sides of the switching element. Here the heaters can conveniently be made of the same material. In other embodiments, to simplify the fabrication process, the heaters are disposed on the same surface of the bridge on opposite sides of the switching element. Here, the thermal expansion coefficient of one heater should be greater than that of the portion of the bridge it overlays, and the thermal expansion coefficient of the other heater should be less than that of the portion of the bridge it overlays. Preferred embodiments employing such heaters with a flexible membrane bridge will be illustrated hereinafter. While embodiments might be envisaged where the heaters are activated optically for example, in the preferred embodiments described below the heaters are activated electrically.

If desired, to reduce the force required to effect switching, the bridge may be formed with a spring structure on each side of the switching element in a direction along the extent of the bridge. Such a spring structure may comprise, for example, lateral and/or central cut-away portions to facilitate flexing of the bridge between its stable states In the preferred embodiments of this aspect of the invention detailed below the bridge has a substantially symmetrical curved profile in cross section along its extent across the recess, and the switching element is mounted substantially mid-way along the bridge. In these embodiments, the switching element is mounted on the side of the bridge remote from the recess. This allows convenient implementation of a flip-chip mounted switch arrangement as discussed further below. The switching element itself can vary according to the type of switch in which it is employed. In an electrical switch, for example, the switching element may be an electrical contact. In an optical switch, the switching element comprises an optical element. While the optical element could be a shutter, lens, grating or other element for switching a light beam, in the preferred embodiments the optical element comprises a mirror.

In switches embodying the first aspect of the invention described above, the switching element is translated between its on and off positions as the bridge switches between its stable states. In accordance with a second aspect of the invention there is provided a microsystem switch comprising:

a support defining a recess;

an elongate torsion member mounted on the support and bridging the recess;

a flexible bridge mounted on the support and bridging the recess in a direction substantially perpendicular to the torsion member, the bridge being connected to the torsion member at the cross-point thereof so that a first section of the bridge extends between the cross-point and one side of the recess and a second section of the bridge extends between the cross-point and the opposite side of the recess, wherein the bridge is shaped so as to hold selectively a first stable state, in which the first section of the bridge bulges into the recess and the second section of the bridge bulges out of the recess, and a second stable state in which the first section of the bridge bulges out of the recess and the second section of the bridge bulges into the recess;

an actuator for effecting flexing of the bridge out of each of the stable states into the other of the stable states; and a switching element mounted at the cross-point of the bridge and torsion member;

wherein movement of the bridge between the stable states effects twisting of the torsion member and rotation of the switching element between an on position and an off position.

Embodiments of this aspect of the invention therefore employ similar principles to embodiments of the first aspect of the invention, but the switching element describes a rotational movement between the on and off positions. This is achieved by provision of the torsion member which is arranged as described above effectively to partition the bridge into two sections, the bridge being shaped to hold one stable state in which one section bulges into, and the other section bulges out of, the recess, and another stable state in which this configuration is reversed. The switching element is mounted at the cross-point of the bridge and torsion member so that, as the bridge moves between its stable states, the switching element undergoes a rotation stabilised by the torsion member which twists during this movement. Embodiments of this aspect of the invention thus provide the advantages of simple construction and operation, with low power requirements, small realisation and ease of fabrication as with embodiments discussed above, and additionally provide a more controlled, rotational movement of the switching element. This provides for particularly advantageous switch designs as discussed further below.

While other arrangements might be envisaged, in preferred arrangements the cross-point is located substantially mid-way along the extent of each of the bridge and torsion member across the recess. Other preferred and optional features described in relation to embodiments of the first aspect of the invention apply equally here where appropriate. For example, the bridge preferably comprises a flexible membrane, and the switching element is preferably mounted on the side of the bridge remote from the recess. The actuator preferably comprises a pair of bimorph actuation layers, most preferably heaters, each extending over a section of the bridge whereby flexing of the bridge is effected by bimorph forces as described above. In addition, while the torsion member could be formed in more than one section, in preferred embodiments the torsion member comprises a simple torsion bar. Further, where the switching element comprises a substantially planar element (as in the preferred optical switch embodiments where the switching element comprises a mirror), the switching element is preferably mounted so as to rotate substantially in its own plane between the on and off positions.

The invention also provides switching apparatus comprising an array of switches as described above in relation to the first or the second aspect of the invention. The invention further provides an optical switching device comprising: a switch as described above having an optical switching element; and a waveguide structure having an optical waveguide and defining a cavity intersecting the waveguide; wherein the switch is disposed relative to the waveguide structure such that movement of the bridge between the stable states moves the optical element in the cavity between the on position, in which the optical element intersects the optical path defined by the waveguide, and the off position in which the optical element does not intersect the optical path. A still further aspect of the invention provides optical switching apparatus comprising an array of such optical switching devices. In such switching apparatus, the waveguide structures of the devices are preferably integrated in a waveguide array chip, and the switches of the devices are preferably integrated in a switch array chip, providing a convenient flip-chip mounted arrangement.

Preferred embodiments of the invention will now be described, by way of example, with reference to the accompanying drawings in which.

Figure 1:
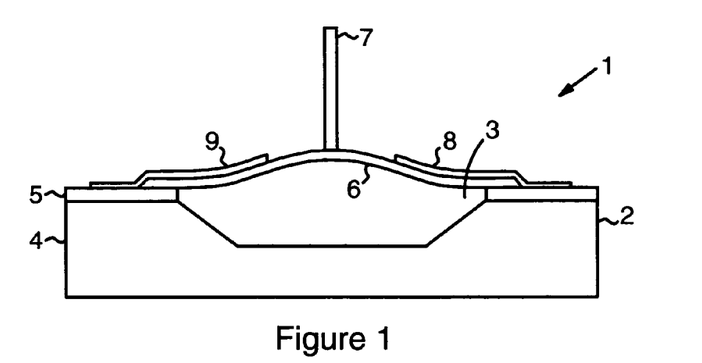
FIG. 1 illustrates an optical switch embodying the first aspect of the invention.

FIGS. 1 to 3c show schematic side views of one embodiment of a MEMS switch 1. Referring to FIG. 1, the switch 1 includes a support 2 having a recess 3 in the surface thereof. The support 2 here is formed by a substrate 4 and a surface layer 5 resulting from the fabrication process for formation of the recess 3. The switch 1 also includes a bridge structure in the form of flexible membrane 6 which is mounted on the surface of support 2 so as to bridge the recess 3. The bridge membrane 6 has a symmetrical curved profile as illustrated in the figure. This shape is achieved in this embodiment by a fabrication process which results in the membrane being under compressive stress, so that the membrane buckles and bulges out of the recess into the curved shape shown. Various fabrication processes can be employed to achieve this prestressing of the membrane as will be apparent to those skilled in the art. For example, a membrane formed by a layer of silicon can be oxidised to impose a force which tends to cause elongation of the membrane. The membrane will thus be under compressive stress while still attached to the wafer, and when the membrane is released (by etching of the recess) the membrane will "expand" and buckle to achieve the shape shown in the figure. The membrane could also be deposited with a certain degree of compressive stress, for example by a chemical vapour deposition or plasma enhanced chemical vapour deposition process as will be apparent to those skilled in the art. As a further example, the membrane could be formed as a flat layer and a mechanism employed subsequently to push one (or each) end of the membrane towards the other, thus compressing the membrane and forcing it to buckle into the shape illustrated.

The resulting membrane 6 constitutes a bistable structure, having a generally convex stable state as shown in FIG. 1 where the membrane bulges out of the recess 3, and a generally concave stable state in which the membrane bulges into the recess 3. A switching element in the form of mirror 7 is mounted mid-way along membrane 6 on the side remote from the recess. The plane of the mirror extends generally perpendicular to the longitudinal extent of the membrane. The switch 1 also includes an actuator for effecting flexing of the membrane 6 between its stable states. In this embodiment the membrane is formed of a dielectric material, and the actuator comprises a pair of resistive heaters 8, 9 formed by conductive layers extending over the upper surface of the membrane, on either side of mirror 7, as illustrated. One heater is a pull-down heater 8 and is formed of a material having a thermal expansion coefficient $\alpha_d$ which is greater than the thermal expansion coefficient $\alpha_m$ of the membrane 6. The other heater is a pull-up heater 9, and the material of this heater has a thermal expansion coefficient $\alpha_u$ which is less than $\alpha_m$.

Figure 2:
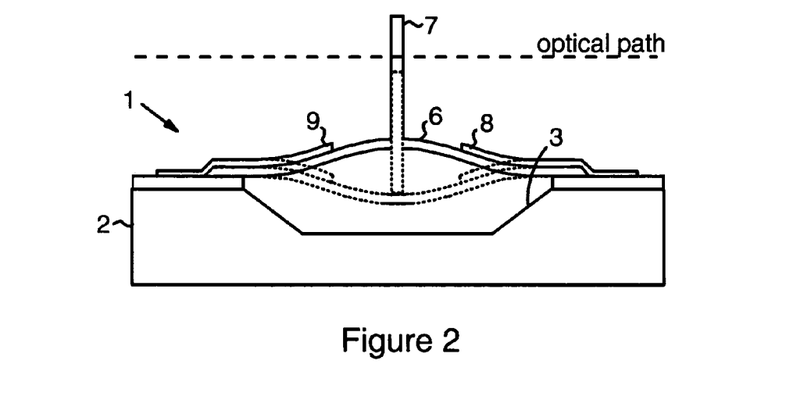
FIG. 2 shows the two stable states of the switch of FIG. 1.
Figure 3A:
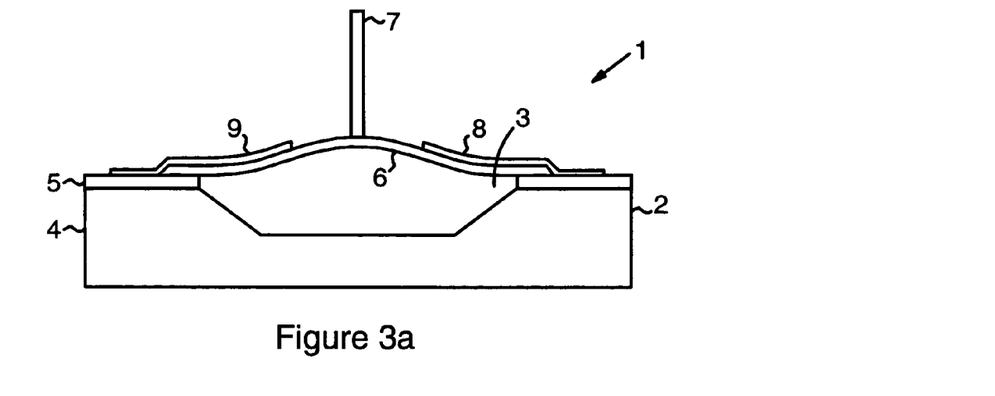
FIGS. 3a to 3c illustrate successive stages in switching of the FIG. 1 switch.
Figure 3B:
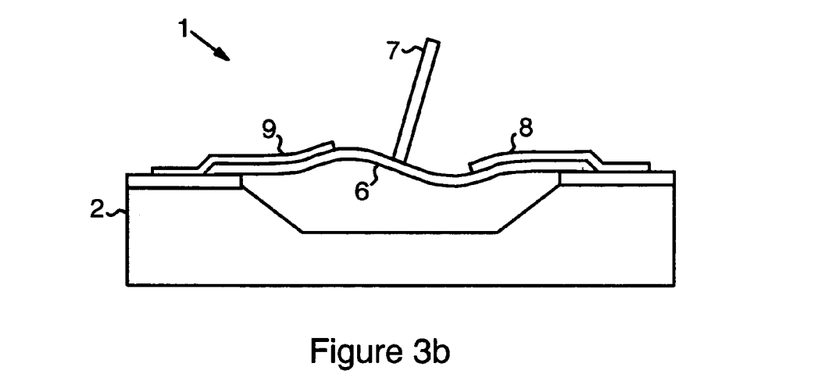
Figure 3C:
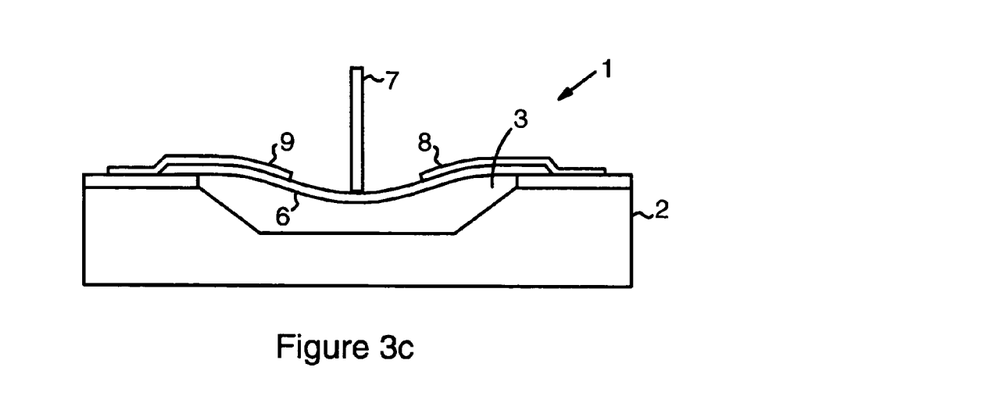

In operation, when the switch is in the convex state of FIG. 1, application of a current to heat the pull-down heater 8 results in a downwardly-directed bimorph force which effects flexing of membrane 6 out of its convex stable state into its concave stable state as shown by the broken lines in FIG. 2. In this state, application of a current to heat the pull-up heater 9 results in an upwardly directed bimorph force effecting flexing of the membrane out of the concave state back into the convex state. This movement of the membrane 6 between its stable states results in movement of mirror 7 between an on position (convex state) for intersecting an optical path as indicated in FIG. 2, and an off position (concave state) wherein the mirror does not intersect the optical path. FIGS. 3a to 3c show the configuration of the switch 1 at successive stages in the switching process, FIG. 3a showing the convex stable state, FIG. 3c showing the concave stable state, and FIG. 3b showing the (unstable) intermediate state wherein the membrane has a generally S-shaped configuration.

Figure 4:
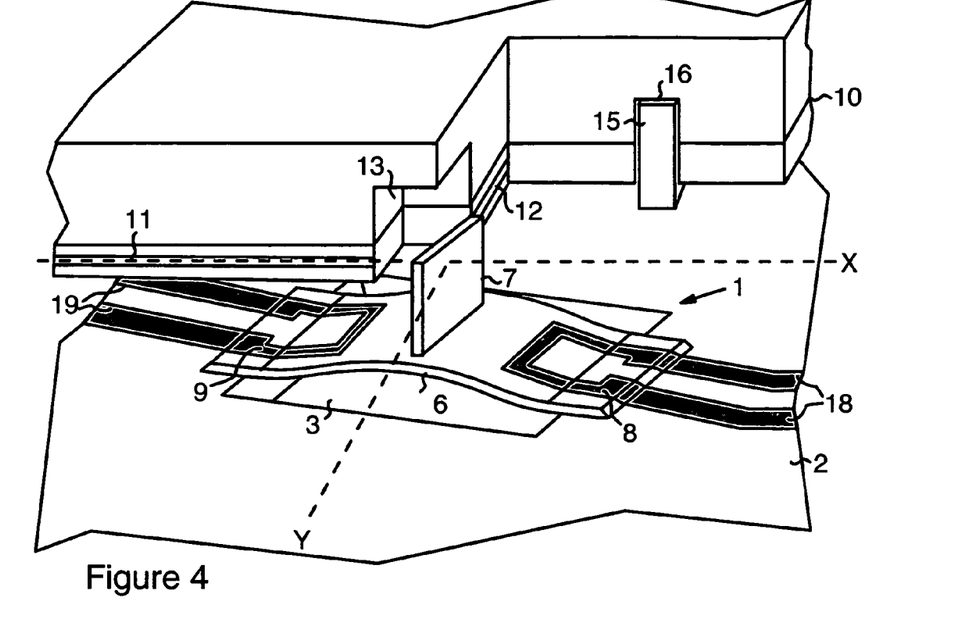
FIG. 4 illustrates a switching device incorporating the switch of FIG. 1.

FIG. 4 shows the switch 1 incorporated in an optical switching device embodying the invention. The device is partially cut-away in this schematic view to illustrate the arrangement more clearly. The device includes a waveguide structure 10 having a pair of crossed waveguides 11 and 12. While other configurations are possible, in this particular example the waveguides 11, 12 are arranged along orthogonal X and Y axes. A cavity 13 is provided in structure 10 at the cross-point of the waveguides 11 and 12. Switch 1 is arranged relative to waveguide structure 10 so that the mirror 7 moves in the cavity 13 between its on and off positions. In the on position, the mirror intersects both the X and Y optical paths, with the plane of the mirror at 45° to each, so that light incident on the mirror from one waveguide is reflected into the other waveguide. In the off position, the mirror is withdrawn from the optical paths so that light propagates across the cavity and continues in the same waveguide. Cavity 13 is ideally filled with index-matching fluid to inhibit cross-connection optical losses.

The form of heaters 8 and 9 can be seen more clearly in this figure, the electrical connections for supplying current to these heaters being indicated at 18 and 19 respectively. The switch 1 and waveguide structure 10 are self-aligned by means of mesas 15 (only one of which is shown in the figure) on support 2 which engage in recesses 16 of the waveguide structure. While a single switching device is shown here, in practice the device will generally be one of multiple such devices provided in an optical switching array. In such an array, the waveguide structure 10 is provided by a waveguide array chip in which multiple waveguides are arranged in a grid. Similarly, the switches 1 are provided on a switching array chip which is flip-chip mounted with the waveguide chip so that one switch operates at the cross-point of each pair of waveguides.

Figure 5:
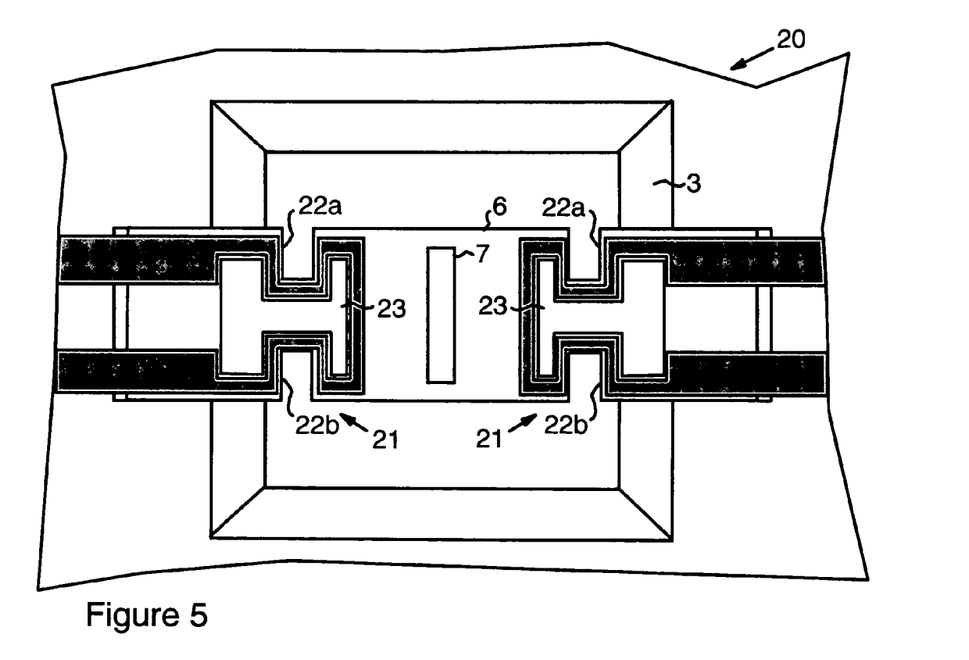
FIG. 5 illustrates a modified version of the switch of FIG. 1.

As most clearly seen in FIG. 1, in this embodiment the heaters 8, 9 extend along the membrane 6 over the steepest portion of the curved membrane profile on each side of the mirror. In these regions the bimorph effect operates to greatest effect in inducing flexing of the membrane. If desired, however, the membrane can be formed with a spring structure to further assist the switching process. FIG. 5 shows a plan view of a switch 20 incorporating this modification. The switch 20 is generally similar to switch 1 and like parts are labelled accordingly. In this embodiment, however, the membrane 6 is formed with a spring structure, indicated generally at 21, on either side of the mirror 7. Each spring structure 21 is formed by a pair of lateral cut-away portions 22a and 22b, and a central cut-away portion 23. These spring structures 21 provide a degree of longitudinal compliance in the bridge membrane, so that the energy needed to reach the toggling point of the membrane is reduced. While providing a degree of compliance, however, the spring structures 21 should be stiff enough so that vibration or shocks to which the switch may be subjected in use do not produce enough force to toggle the membrane. A trade-off therefore exists between these two considerations.

Figure 6:
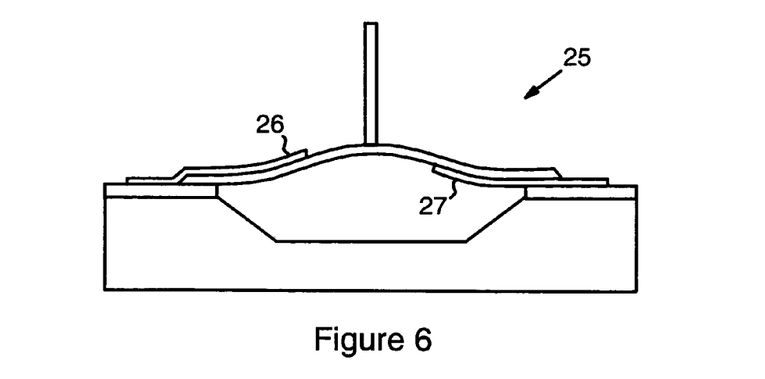
FIG. 6 shows another example of an optical switch embodying the first aspect of the invention.

FIG. 6 shows a schematic side view of another embodiment of an optical switch. The switch 25 of this embodiment is generally similar to the switch 1 of FIG. 1, and only the differences will be described here. As illustrated in the figure, the heaters 26, 27 here are provided on opposite surfaces of the membrane bridge. This configuration allows the heaters 26, 27 to be made of the same material. The thermal expansion coefficient of this material can be either greater than or less than that of the membrane, the choice here determining which of the upper- and lower-surface heaters serves as the pull-down heater, and which serves as the pull-up heater.

Figure 7:
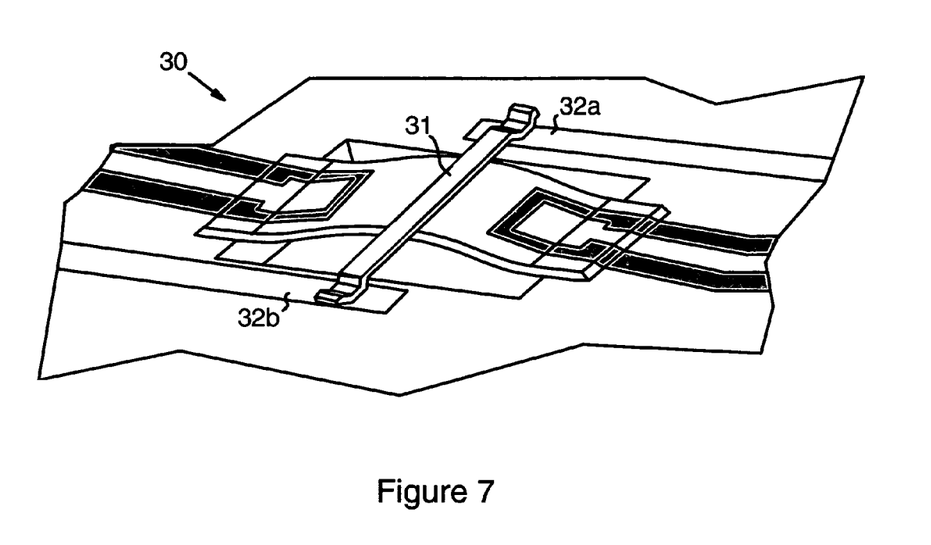
FIG. 7 illustrates one example of an electrical switch embodying the first aspect of the invention.
Figure 8:
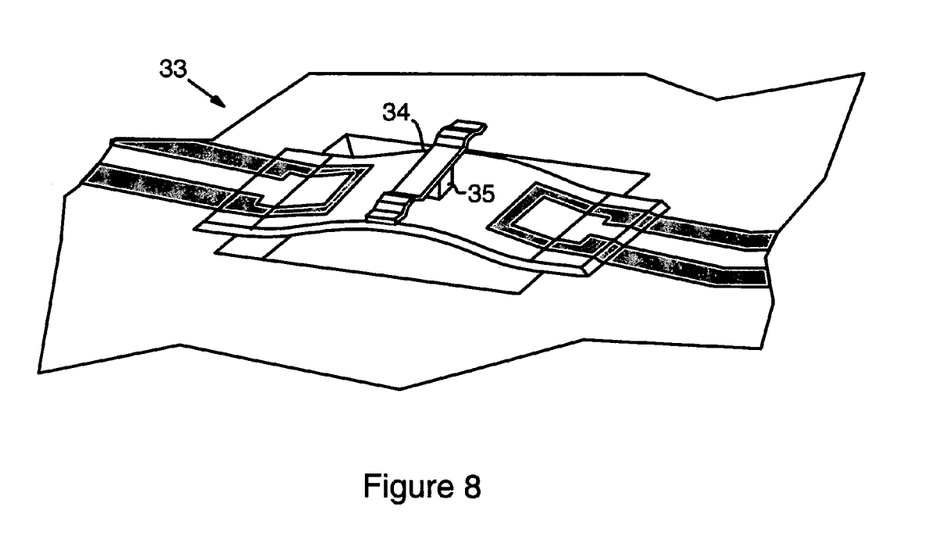
FIG. 8 illustrates another example of an electrical switch embodying the first aspect of the invention.

The switch designs described above can also be employed for electrical switches. FIGS. 7 and 8 show two examples where the design corresponds generally to that of FIG. 1, but the mirror 7 is replaced by an electrical contact. In the switch 30 of FIG. 7, a bridging contact 31 is mounted on the membrane so as to extend substantially perpendicular to the longitudinal extent of the membrane. The bridging contact 31 extends laterally beyond the sides of the membrane so that, when the membrane is in the concave stable state, the contact 31 connects with electrical contacts 32a and 32b on the support. The concave state here thus corresponds to the on position of the switch. In the switch 33 of FIG. 8, a bridging contact 34 is mounted on a spacer 35 on the membrane. This contact is arranged to connect with electrical contacts provided on a facing structure (not shown), such as a contact array chip with electrical contacts for an array of switches 33. Here, therefore, the convex stable state corresponds to the on position of the switch. In both embodiments, the bridging contact 31, 34 should be sufficiently mechanically compliant to accommodate fabrication tolerances and provide a suitable contact pressure.

Figure 9:
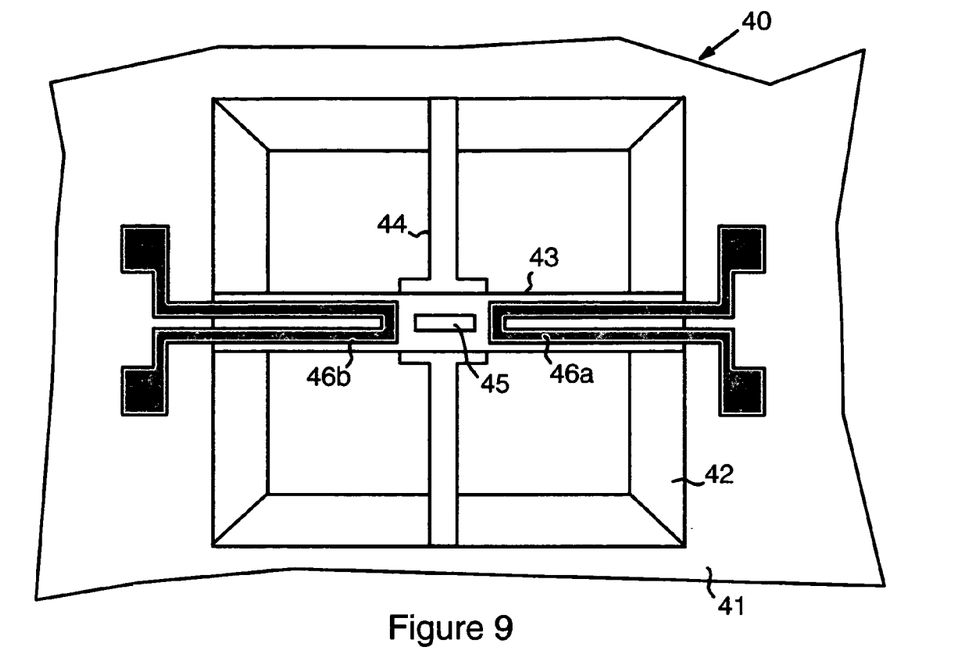
FIG. 9 illustrates an optical switch embodying the second aspect of the invention.

FIG. 9 is a schematic plan view of a MEMS switch 40 embodying the second aspect of the invention. The switch 40 includes a support 41, having a recess 42 in the surface thereof, and a bridge in the form of flexible membrane 43 which extends across the recess 42. The switch further includes a torsion member in the form of bar 44 which bridges the recess in a direction substantially perpendicular to the membrane 43. Torsion bar 44 can be made of any suitable material which provides for the torsional movement of the bar described below. The torsion bar 44 and bridge membrane 43 are connected together at the cross-point thereof, and a mirror 45 is mounted at the cross-point on the side remote from the recess 42. The plane of mirror 45 extends substantially parallel to the longitudinal extent of the membrane 43. The membrane 43 is formed of a dielectric material, and the switch actuator again comprises a pair of resistive heaters 46a, 46b extending over the upper surface of the membrane on either side of the cross-point. The heaters 46a, 46b are formed as layers of the same conductive material, this material having a thermal expansion coefficient $\alpha_h$ which is different to the thermal expansion coefficient $\alpha_m$ of the membrane material.

Figure 10:
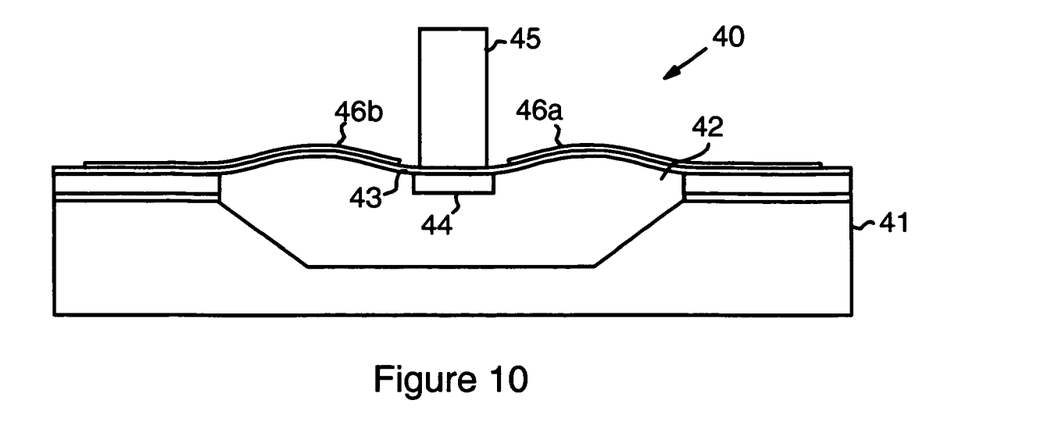
FIG. 10 illustrates an unstable state of the FIG. 9 switch.
Figure 11A:
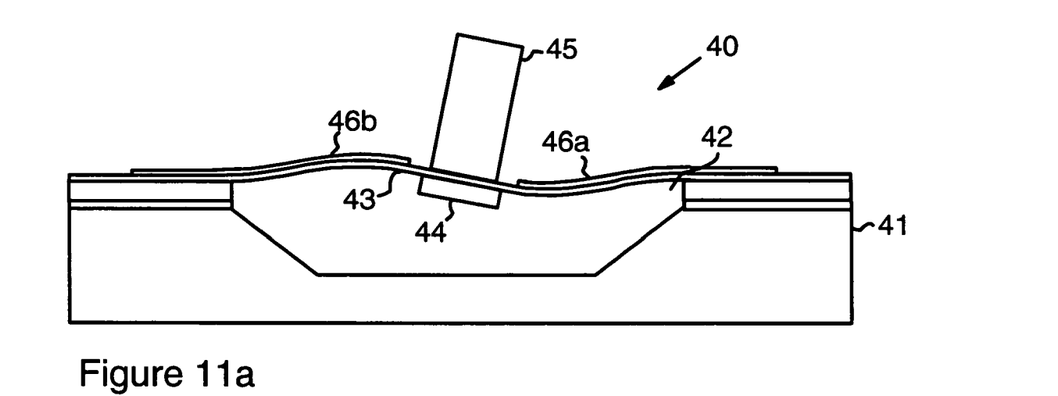
FIGS. 11a and 11b show the two stable states of the FIG. 9 switch.
Figure 11B:
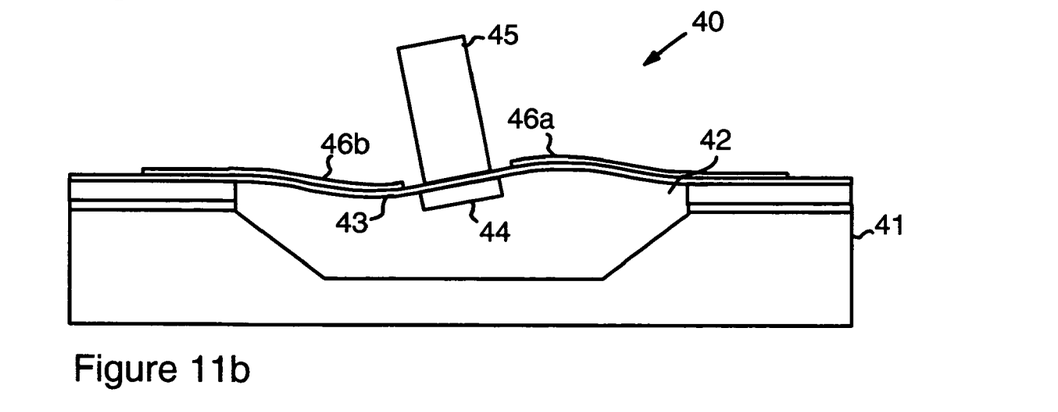

As with the earlier embodiments, the membrane 43 is shaped so as to hold selectively one of two stable states. In this embodiment, however, the configuration of the membrane is somewhat different. FIG. 10 illustrates the overall symmetry of the design, where it is to be understood that the shape shown in this figure is mechanically unstable. In the form illustrated, the two sections of the membrane 43 extending between the torsion bar 44 and respective sides of the recess 42 have a convex, curved profile. In this unstable state the membrane is under compressive stress so that, when released, the membrane adopts one of two stable states having a generally S-shaped configuration. One stable state is shown in FIG. 11a, where the right-hand section of the membrane bulges into recess 42, and the left-hand section of the membrane bulges out of recess 42. FIG. 11b shows the other stable state where the right-hand section of the membrane bulges out of, and the left-hand section bulges into, the recess 42. Various fabrication processes, such as those described above in relation to the first embodiment, can be employed to achieve the membrane shape of this embodiment as will be apparent to those skilled in the art. In FIGS. 10 to 11b, the two surface layers shown on top of the substrate of support 41 result from the fabrication steps for torsion bar 44 in this example, though clearly these layers are not necessary for operation of the device and may not be present in other embodiments.

Toggling of the membrane between its stable states is achieved as before by application of power to heaters 46a, 46b. Which of the heaters is activated to cause toggling out of a given state depends on whether $\alpha_h$ is greater or less than $\alpha_m$. Assuming here that $\alpha_h$ is less than $\alpha_m$, then the heater on the "high side" is activated to effect switching. Thus, when heater 46b is activated in the state shown in FIG. 11a, the differential expansion results in a downwardly-directed bimorph force on this side, causing flexing of the membrane into the state shown in FIG. 11b. Similarly, activation of heater 46a in FIG. 11b effects flexing of the membrane back into the state shown in FIG. 11a. It can be seen from these figures that movement of membrane 43 between its stable states effects twisting of torsion bar 44 and rotation of the mirror 45 in its own plane. In use, one of the mirror positions constitutes an on position, where the mirror intersects an optical path to reflect the incident light beam, and the other mirror position constitutes an off position where the mirror is retracted from the optical path and the light beam continues to propagate along the path.

The design of switch 40 provides a number of advantages over the switch designs of the earlier embodiments. It can be seen from FIGS. 3a to 3c that, with the earlier designs where the mirror undergoes translational movement between its on and off positions, the mirror tends to wobble out of its own plane during switching due to the asymmetry of the switching action. With switch 40, however, the rotational movement of mirror 45, stabilised by the torsional movement of torsion bar 44, is highly controlled, and the mirror rotates in its own plane. The design is thus mechanically less compliant to out-of-plane wobble, allowing movement of the mirror in a cavity formed as a narrow trench intersecting a waveguide. With the former design, the mirror would need to be guided to allow movement into a narrow trench. In addition, as mirror 45 moves in a fluid-filled cavity in the waveguide structure, the rotational movement constitutes a sheer action which presents less disturbance to the fluid than the mirror movement in the earlier designs. Further, the design of switch 40 allows the heaters 46a, 46b to be formed of the same metal applied to the same surface of the membrane 43. With the earlier design, heaters formed on the same surface of the membrane must be formed of different materials.

Figure 12:
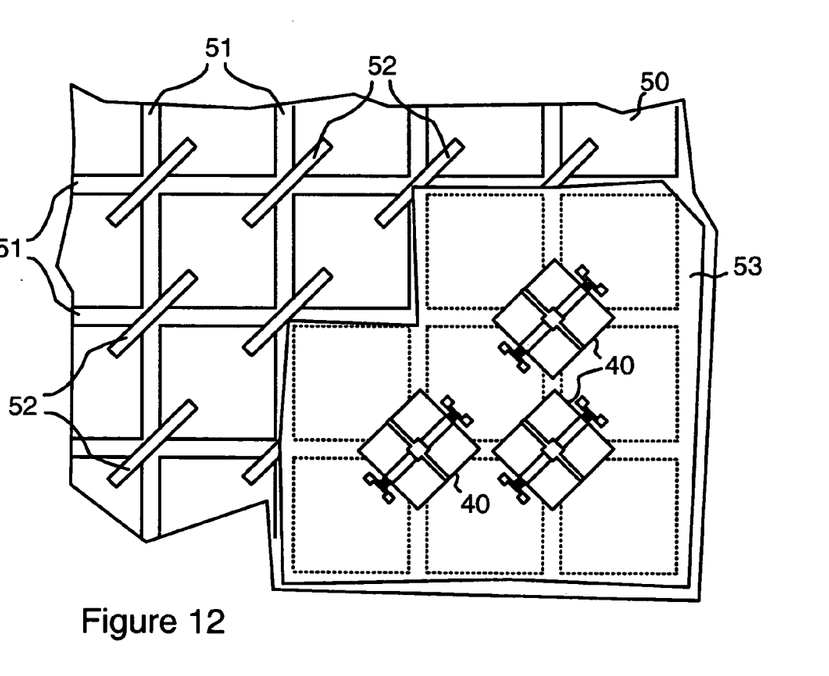
FIG. 12 illustrates optical switching apparatus incorporating an array of optical switches as shown in FIG. 9.

FIG. 12 shows a schematic, partially cut-away plan view of switching apparatus comprising an integrated array of optical switching devices utilising switch 40. A waveguide array chip 50 provides a mesh or grid of waveguides 51. In this particular example, the waveguides are arranged in an orthogonal grid. At the cross-point of each pair of waveguides 51, a cavity is formed as a narrow, deep-etched trench 52 orientated as shown. A flip-chip mounted switching array chip 53 provides an array of switches 40 arranged so that the mirrors 45 of the switches project downwardly into trenches 52, one at each of the waveguide cross-points, with the plane of each mirror aligned with the longitudinal extent of the corresponding trench. The mirror of each switch can thus be rotated in the trench between the on position, in which the mirror reflects light propagating along one waveguide into the orthogonal waveguide, and the off position in which the mirror is withdrawn from the optical path and light continues to propagate along the input waveguide.

Figure 13:
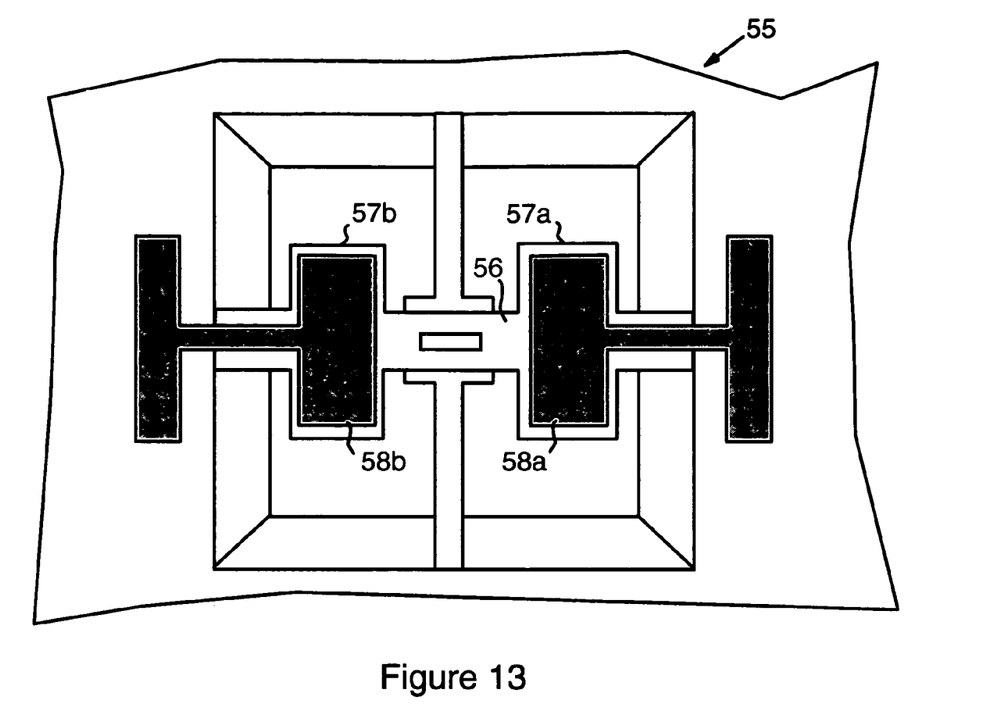
FIGS. 13 and 14 illustrate another example of an optical switch embodying the second aspect of the invention.
Figure 14:
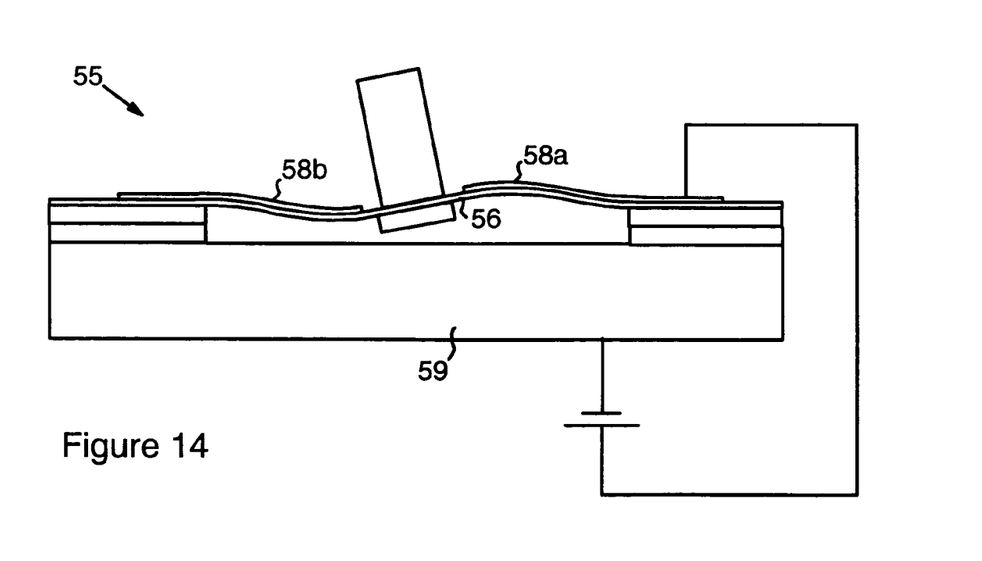

FIGS. 13 and 14 are schematic plan and side views respectively of another embodiment of a MEMS switch. The switch 55 of this embodiment is of similar design to switch 40, and only the key differences will be discussed here. An electrostatic actuation mechanism is employed for switch 55, and in this embodiment the bridge membrane 56 is formed with laterally enlarged portions 57a, 57b on either side of the cross-point with the torsion bar. A metal layer is applied on each side of the cross-point forming pads 58a, 58b on portions 57a, 57b respectively. The substrate 59 here is also formed of conductive material, and the switching action is effected by application of a voltage between the substrate and the conductive pad on the "high side" of the bridge membrane. This is illustrated in FIG. 14 where, in the state shown, the right-hand section of the membrane is the high side and the voltage is thus applied between pad 58a and substrate 59. The resulting force of attraction between pad 58a and substrate 59 pulls the high side down and thus effects flexing of the membrane into its other stable state. Switching back to the initial state is then effected by applying a voltage between pad 58b and the substrate.

It will be seen that the above embodiments provide highly efficient microsystem switch designs with simple, robust construction and operation as well as low power requirements, power being required only to effect switching between the two stable states. The designs offer ease of fabrication and small-scale realisation, allowing the construction of highly efficient switching arrays. It will be appreciated, however, that while particularly preferred embodiments have been described in detail above, many changes and modifications can be made to these embodiments. By way of example, while the thermal bimorph actuation systems described above are preferred as a particularly simple and effective switching mechanism, an electrostatic actuation mechanism like that of FIG. 14 could be employed if desired in switches of the general type shown in FIG. 1. Other actuation mechanisms, such as electromagnetic mechanisms, can also be envisaged for switches of both the general types shown in FIGS. 1 and 9. In FIGS. 13 and 14 for example, pads 58a, 58b could be formed of a layer of magnetic material, and a coil could be provided on the substrate beneath each magnetic layer. Power can then be applied to a coil to attract the high-side magnetic layer and thus effect toggling of the switch. As a further alternative to the electrostatic mechanism of FIG. 14, embodiments can be envisaged where the recess is fluid-filled and a nozzle or the like is provided in the substrate beneath each bridge section on either side of the mirror. An impulse could be applied to the nozzle on the low-side of the bridge to generate a pressure wave to push the low side up and thus toggle the switch. Further possibilities include piezoelectric or shape memory alloy actuation mechanisms as will be apparent to those skilled in the art. Moreover, in some embodiments the compressive stress characteristics and/or design geometry of the flexible bridge can be engineered to provide enhanced stability or give an asymmetric switching action, whereby the energy required to effect switching in one direction is greater than that required for the other direction. Many other changes can of course be made to the above embodiments without departing from the scope of the invention.

The invention claimed is:

1. A microsystem switch comprising:
a support defining a recess;
a flexible bridge mounted on the support and bridging the recess, the bridge being shaped so as to hold selectively a concave stable state, in which the bridge bulges into the recess, and a convex stable state in which the bridge bulges out of the recess;
an actuator for effecting flexing of the bridge out of each of the stable states into the other of the stable states; and
a switching element mounted on the bridge such that movement of the bridge between the stable states moves the switching element between an on position and an off position;
wherein the bridge comprises a flexible membrane and wherein the actuator comprises a pair of bimorph actuation layers, each bimorph actuation layer extending over a respective portion of the bridge to form therewith a bimorph structure such that differential expansion in the bimorph structure on activation of the bimorph actuation layer exerts a force causing flexing of the bridge out of one stable state into the other stable state, the arrangement being such that activation of one of said layers causes flexing of the bridge out of the convex stable state into the concave stable state, and activation of the other layer causes flexing of the bridge out of the concave stable state into the convex stable state.

2. A switch as claimed in claim 1 wherein each bimorph actuation layer comprises a heater having, a thermal expansion coefficient different to that of said respective portion of the bridge, whereby heating of the heater produces said differential expansion.

3. A switch as claimed in claim 2 wherein the heaters are disposed on the same surface of the bridge on opposite sides of the switching element, the thermal expansion coefficient of one heater being greater than that of said respective portion and the thermal expansion coefficient of the other heater being less than that of said respective portion.

4. A switch as claimed in claim 2 wherein the heaters are disposed on opposite surfaces of the bridge and on opposite sides of the switching element.

5. A switch as claimed in claim 1 wherein the bridge is mounted on a substantially flat surface of the support and the recess is formed in said surface of the support.

6. A switch as claimed in claim 1 wherein the bridge has a substantially symmetrical curved profile in cross-section along the extent of the bridge across the recess, and wherein the switching element is mounted substantially mid-way along said extent.

7. A switch as claimed in claim 1 wherein the switching element is mounted on the side of the bridge remote from the recess.

8. A switch as claimed in claim 1 wherein the bridge is formed wit a spring structure on each side of the switching element in a direction along the extent of the bridge across the recess to facilitate flexing of the bridge out of each stable state into the other stable state.

9. A switch as claimed in claims 1 wherein the switching element comprises an electrical contact.

10. A microsystem switch comprising:
a support (41) defining a recess;
an elongate torsion member mounted on the support and bridging the recess;
a flexible bridge mounted on the support and bridging the recess in a direction substantially perpendicular to the torsion member, the bridge being connected to the torsion member at the cross-point thereof so that a first section of the bridge extends between the cross-point and one side of the recess and a second section of the bridge extends between the cross-point and the opposite side of the recess, wherein the bridge is shaped so as to hold selectively a first stable state, in which the first section of the bridge bulges into the recess and the second section of the bridge bulges out of the recess, and a second stable state in which the first section of the bridge bulges out of the recess and the second section of the bridge bulges into the recess;
an actuator for effecting flexing of the bridge out of each of the stable states into the other of the stable states; and
a switching element mounted at the cross-point of the bridge and torsion member;
wherein movement of the bridge between the stable states effects twisting of the torsion member and rotation of the switching element between an on position and an off position.

11. A switch as claimed in claim 10 wherein the cross-point is located substantially mid-way along the extent of each of the bridge and torsion member across the recess.

12. A switch as claimed in claim 10 wherein the bridge comprises a flexible membrane and the torsion member comprises a torsion bar.

13. A switch as claimed in claims 10 wherein the switching element is mounted on the side of the cross-point remote from the recess.

14. A switch as claimed in claims 10 wherein the switching element comprises a substantially planar element mounted for rotation substantially in the plane thereof between the on and off positions.

15. A switch as claimed in claims 10 wherein the actuator comprises a pair of bimorph actuation layers, each bimorph actuation layer extending over a said section of the bridge to form therewith a bimorph structure such that differential expansion in the bimorph structure on activation of the bimorph actuation layer exerts a force causing flexing of the bridge out of one stable state into the other stable state, the arrangement being such that activation of one of said layers causes flexing of the bridge out of the first stable state into the second stable state, and activation of the other layer causes flexing of the bridge out of the second stable state into the first stable state.

16. A switch as claimed in claim 15 wherein each bimorph actuation layer comprises a heater having a thermal expansion coefficient different to that of said section, whereby heating of the heater produces said differential expansion.

17. A switch as claimed in claim 16 wherein the heaters are (46a, 46b) disposed on the same surface of the bridge (43), one on the first section of the bridge and the other on the second section of the bridge.

18. A switch as claimed in claims 10 wherein the support comprises a conductive substrate and the actuator comprises a conductive layer on each of the first and second sections of the bridge, whereby application of a voltage between the substrate and the conductive layer on a said section pulls that section towards the recess.

19. A switch as claimed in claim 10 wherein the switching element comprises an optical element.

20. A switch as claimed in claim 19 wherein the optical element comprises a mirror.

21. A switch as claimed in claim 10 further including an array of said switches.

22. A switch as claimed in claim 19 further including a waveguide structure having an optical waveguide and defining a cavity intersecting the waveguide;
wherein the switch is disposed relative to the waveguide structure such that movement of the bridge between said stable states moves the optical element in said cavity between the on position, in which the optical element intersects the optical path defined by the waveguide, and the off position in which the optical element does not intersect the optical path.

23. A switch as claimed in claim 22 wherein:
the waveguide structure has a pair of crossed waveguides and the cavity intersects both waveguides at the cross-point thereof;
the optical element comprises a mirror, and
the switch is disposed relative to the waveguide structure such that, in the on position, the mirror is arranged to reflect light from one waveguide into the other.

24. A switch as claimed in claim 22 further including an array of said switches.

25. A switch as claimed in claim 23 further including an array of said switches wherein:
the waveguide structures of the switches are provided by a waveguide array chip and the switches are provided by a switch array chip;
the waveguides are arranged in a grid on the waveguide array chip;
the minor of each switch is mounted on the side of the bridge remote from the recess; and
the switch array chip is disposed relative to the waveguide array chip such that the minor of each switch is located for movement between the on and off positions in the cavity at the cross-point of a respective pair of waveguides.

* * * * *